United States Patent [19]

Marshall

[11] Patent Number: 4,768,187
[45] Date of Patent: Aug. 30, 1988

[54] SIGNAL TRANSMISSION SYSTEM AND A TRANSMITTER AND A RECEIVER FOR USE IN THE SYSTEM

[75] Inventor: Christopher B. Marshall, Horley, England

[73] Assignee: U.S. Philips Corp., New York, N.Y.

[21] Appl. No.: 880,399

[22] Filed: Jun. 30, 1986

[30] Foreign Application Priority Data

Jul. 8, 1985 [GB] United Kingdom ................. 8517230

[51] Int. Cl.$^4$ ................................................ H04J 1/00
[52] U.S. Cl. .................................... 370/69.1; 370/120; 370/123
[58] Field of Search ............... 370/69.1, 70, 120, 121, 370/20, 123; 375/39

[56] References Cited

U.S. PATENT DOCUMENTS

| | | | |
|---|---|---|---|
| 3,742,149 | 6/1973 | Yoshida et al. | 370/69.1 |
| 4,264,975 | 4/1981 | Voorman | 370/20 |
| 4,531,224 | 7/1985 | McCallister | 370/20 |

*Primary Examiner*—Douglas W. Olms
*Assistant Examiner*—Frank M. Scutch, III

*Attorney, Agent, or Firm*—Thomas A. Briody; Leroy Eason

[57] ABSTRACT

A signal channel system which is particularly suitable for the employment of direct conversion receivers has a block of adjacent transmission frequency bands allocated to it. Each signal channel is split into two sub-channels or parts occupying mutually different frequency bands for transmission and the bands occupied by the sub-channels of the various channels are interleaved. In the receiver the local oscillator is tuned midway between the bands corresponding to the sub-channels of the wanted channel and the corresponding signals are recovered by bandpass filtering, phase-shifting, summing and differencing, demodulating and combining the frequency down-converted outputs of quadrature related mixers to which the received and the local oscillator signals are applied. Although d.c. block capacitors are used in the outputs of the mixers, these can have a low value because the notch formed in the transmission frequency characteristic does not affect the reception of the required signals, so that the receiver can settle rapidly at switch-on.

8 Claims, 2 Drawing Sheets

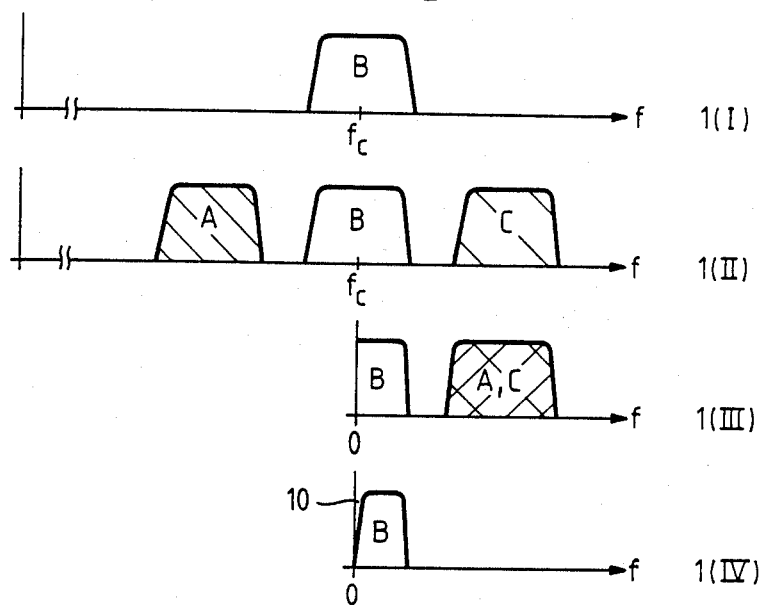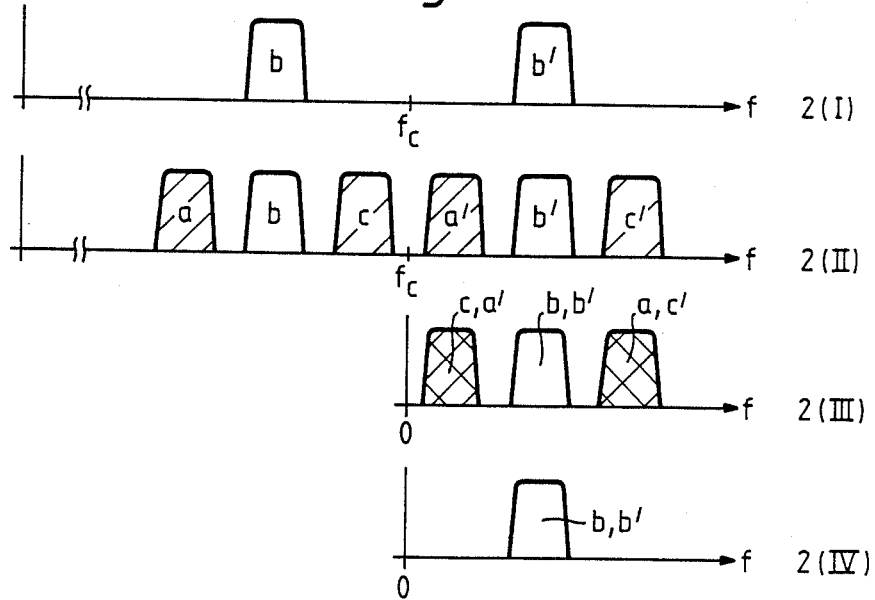

SIGNAL TRANSMISSION SYSTEM AND A TRANSMITTER AND A RECEIVER FOR USE IN THE SYSTEM

The present invention relates to a signal transmission system, for example a radio system, which has particular application for use with direct conversion receivers.

Direct conversion receivers have a number of advantages in that they are a means of avoiding having to provide an anti-image front-end filter and a crystal i.f. filter and in that they can be implemented as an integrated radio receiver. Generally a direct conversion receiver comprises a pair of front-end mixers which produce quadrature related outputs. These outputs are low passed filtered and after one output has been phase shifted by a further 90 degrees then both are applied to a demodulator. The signals emerging from the front end mixers are folded around zero frequency, that is d.c., and the d.c. offset, which is inevitably present, appears in the middle of the signal spectrum. This d.c. offset if amplified would cause the amplifier to operate on one side of its characteristic. To avoid this problem the amplification is done in a number of stages and after each stage a d.c. block capacitor is inserted. A disadvantage of the use of d.c. block capacitors is that in eliminating the d.c. and low frequency components of the signals from the mixers then a notch or hole appears in the middle of the transmtted signal spectrum. Present modulation schemes can tolerate this hole in the middle of the spectrum but it is possible that a modulation scheme might be devised which because of the presence of a hole cannot be implemented using a direct conversion receiver. One method of mitigating the notch-in-the-middle problem is to make the notch as narrow as possible by using high capacitance value capacitors but these have the disadvantages of being physically large and lengthening the time constant of the circuit and its settling time at switch-on.

SUMMARY OF THE INVENTION

An object of the present invention is to avoid the problems caused by a notch being present in the middle of a modulating signal when it is received by direct conversion receiver, and to allow rapid settling of the receiver on switch-on.

According to one aspect of the present invention there is provided a signal transmission system comprising at least two signal channels, each signal channel being split into two sub-channels occupying mutually different frequency bands for transmission, the frequency bands occupied by the sub-channels of one channel being interleaved with the frequency bands occupied by the sub-channels of at least one other channel so that the frequency band occupied by at least one sub-channel of one channel is disposed between the frequency bands occupied by the sub-channels of another channel.

By splitting the message data of each channel is this way then, at the receiver, the local oscillator can be tuned to the mid-point between the frequency bands occupied by the two sub-channels corresponding to a selected channel so that unwanted signals together with the d.c. offset can be removed by bandpass filtering. The d.c. itself can be removed by a small value capacitor. Consequently the receiver can settle very quickly which means that it can be used in applications such as cordless telephones.

The transmission system may be allocated a dedicated block of adjacent frequency bands. In one embodiment the transmission spectrum may comprise a first sequence of frequency bands occupied by first sub-channels of the respective channels arranged in a predetermined order and a second sequence of frequency bands occupied by second sub-channels of the respective channels immediately following the first sequence and arranged in the same predetermined order.

In a second embodiment having more than two signal channels, the channels may be arranged in at least two groups of two or more channels and the transmission spectrum of each group may comprise a first sequence of frequency bands occupied by first sub-channels of the respective channels in the corresponding group arranged in a predetermined order and a second sequence of frequency bands occupied by second sub-channels of these channels immediately following the first sequence and arranged in the same predetermined order.

According to another aspect of the present invention there is provided a transmitter for use in a radio system in accordance with the present invention, the transmitter comprising means for dividing of an input signal into first and second complementary signals, means for translating said complementary signals to first and second sub-channels, respectively, which sub-channels occupy mutually different frequency bands which are situated symmetrically with respect to the transmitter carrier frequency. The translating means may comprise means for modulating said complementary signals onto first and second sub-carriers the frequency of each of which is separated from the carrier frequency by half the sub-channel separation frequency, means for obtaining the sum of and the difference between the outputs of the modulating means, means for producing a relative 90 degree phase-shift between the resulting sum and difference signals, means for frequency translating-up the relatively phase-shifted signals using quadrature related carrier signals, and means for combining the frequency translated signals.

According to a further aspect of the present invention there is provided a direct conversion receiver for use in a radio system in accordance with the present invention, the receiver comprising a pair of mixers for producing quadrature related output signals, a local oscillator for supplying to said mixers a signal having a frequency mid-way between the frequency bands occupied by the sub-channels of a selected channel, bandpass filtering means and phase-shifting means for filtering the output signals from the mixers to obtain signals lying within said frequency bands frequency-translated by said mixers and producing a relative 90 degree phase-shift between the output signals of said mixers, summing and differencing means for obtaining the sum of and the difference between the filtered and relatively phase-shifted signals, respective demodulating means for the resulting sum and difference signals, and means for combining the output signals of said demodulating means to reconstitute the signals originally supplied to the selected channel.

A further advantage of the present invention is that it may not be necessary to accurately match the two front end mixers and the associated signal paths in a direct conversion implementation of the receiver in such a system, as the matching is only needed to separate the two wanted sub-channels from each other, and because these are likely to be of similar amplitude (coming from the same transmitter) a matching accuracy equivalent to 30 dB rejection may suffice.

The present invention will now be explained and described, by way of example, with reference to the accompanying drawings.

BRIEF DESCRIPTION OF THE FIGURES

FIG. 1 shows in diagrams (i) to (iv) the signal spectra for a conventional transmission system using direct conversion receivers, FIG. 2 shows in diagram (i) to (iv) the signal spectra for a transmission system in accordance with the present invention.

In the drawings the same reference numerals have been used to indicate corresponding features.

DESCRIPTION OF THE PREFERRED EMBODIMENT

Figure 3:
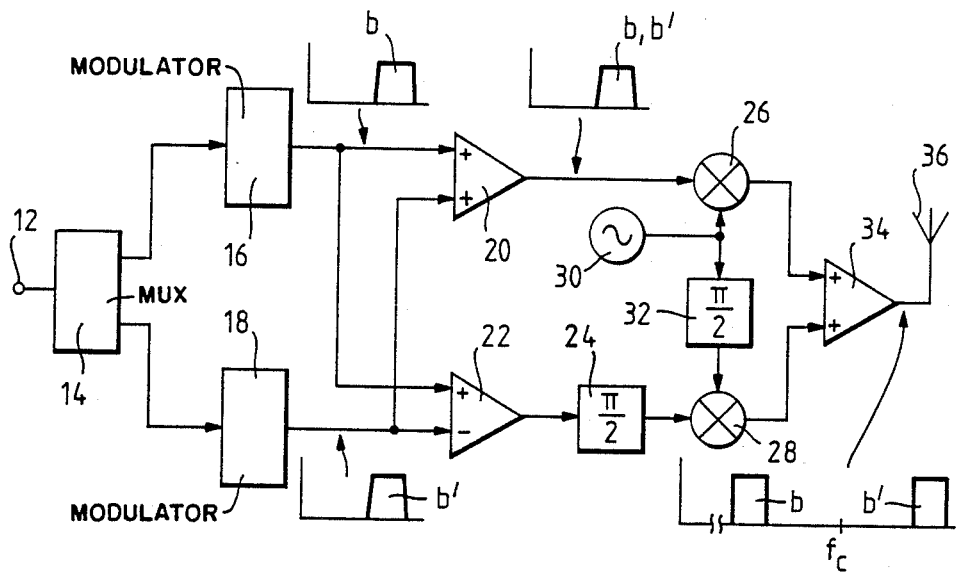
FIG. 3 is a block schematic diagram of a radio transmitter for use in a radio system made in accordance with the present invention.

Referring to FIG. 1, which shows a typical signal spectrum for a transmission system, for example a radio system, using direct conversion receivers, diagram 1(i) shows the transmitter output spectrum comprising the frequency modulated signal B centred on a carrier signal $f_c$. Diagram 1(ii) shows a typical transmission spectrum with adjacent channel signals A and C on either side of the signal B. In the receiver the signal B is mixed down to baseband to produce an i.f. spectrum, diagram 1(iii), in which the signal B is folded about zero and the adjacent channel signals A, C overlap each other. Lap pass filtering plus a d.c. block capacitor to remove any d.c. offset produces a filtered signal spectrum of the signal B as shown in diagram 1(iv) in which the adjacent channel signals A, C have been eliminated and a notch 10 is produced at the low frequency end of the spectrum of the signal B. The signal B is demodulated using for example a phasing method known per se.

Although the notch 10 can be reduced using a high valued d.c. block capacitance this has the disadvantages of being physically large and causing the receiver circuit to have a long time constant which means it requires an undesirably long time to settle at switch-on.

These disadvantages can be overcome by a transmission system in accordance with the present invention. In implementing one such transmission system a system operator requires a dedicated block of transmission frequency bands. Each signal channel is split into two complementary sub-channels, b, b' diagram 2(i), occupying mutually different and separated frequency bands for transmission using a carrier frequency $f_c$. The frequency bands occupied by the sub-channels of one channel are interleaved with the frequency bands occupied by the sub-channels of another channel or other channels so that one has a transmission spectrum of a type shown in diagram 2(ii) in which a, a' and c, c' are the frequency bands occupied by the sub-channels of unwanted adjacent channels. At the direct conversion receiver, the required signals are mixed down to baseband by making the local oscillator frequency equal to the mid-point between its two sub-channels, in this example the carrier frequency $f_c$, with the result that the negative frequency sub-channels a, b and c are folded about zero. In folding the radio spectrum about zero the sub-channels c, a'; b, b' and a, c' overlap each other, diagram 2(iii). By bandpass filtering the output of the mixers, the wanted sub-channels b, b' are obtained and subsequently demodulated by the phasing method and combined to form the signal b+b'. As the wanted signal is spaced from d.c. then it is immaterial if a notch is large or small and consequently a small valued d.c. block capacitor can be used without affecting unduly the settling time at switch-on.

The arrangement of the frequency bands occupied by the sub-channels and their interleaving may be chosen as desired within the requirement that the frequency band occupied by at least one "unwanted" sub-channel lies between the frequency bands occupied by the "wanted" sub-channels. In FIG. 2 an arrangement is shown in which the bands occupied by the sub-channels are arranged in two groups, one group containing the bands occupied by one sub-channel of each channel arranged in a predetermined sequence and the other group containing the bands occupied by the other sub-channels in the same sequence. Thus the transmission spectrum is a, b, c, a', b', c'. If there are more channels then the two group arrangement can be used but as an alternative pairs of groups concatenated with other pairs of groups can be formed. As an example, in the case of nine transmitters A to I then the bands occupied by their respective pairs of sub-channels can be arranged in the spectrum as follows a, b, c, a', b', c'; d, e, f, d', e', f'; g, h, i, g', h', i'.

FIG. 3 illustrates a transmitter architecture suitable for use in a transmission system in accordance with the present invention. A message signal which is to be transmitted is applied to a terminal 12.

In the case of a data message alternate data bits are multiplexed in a multiplexer 14 to two data streams and each then used to modulate a respective sub-carrier at half the sub-channel separation frequency in modulators 16, 18, to produce the sub-channels b, b' as shown. Modulators 16 and 18 may be, for example, amplitude or frequency modulators; they are preferably single-sideband modulators. In the case of an analogue input then the input signal spectrum could for example be split by filters into two frequency bands in the multiplexer 14 which can then be separately translated by modulators 16, 18 up to the sub-channel centre frequency to give the sub-channels b and b'. The modulator outputs are then combined arithmetically in a summing amplifier 20 and a differencing amplifier 22. The output of the amplifier 20 is applied to a mixer 26 and the output of the amplifier 22 is phase shifted by 90 degrees in a phase shifter 24 and then applied to a mixer 28. These outputs are frequency translated up to the carrier centre-frequency $f_c$ by means of a local oscillator 30 whose output is applied directly to the mixer 26 and also is phase shifted by 90 degrees in a phase shifter 32 and applied to the mixer 28. The quadrature related outputs of the mixers 26, 28 are combined in a summing amplifier 34 and applied to an antenna 36. The transmitter output is shown inset.

Figure 4:
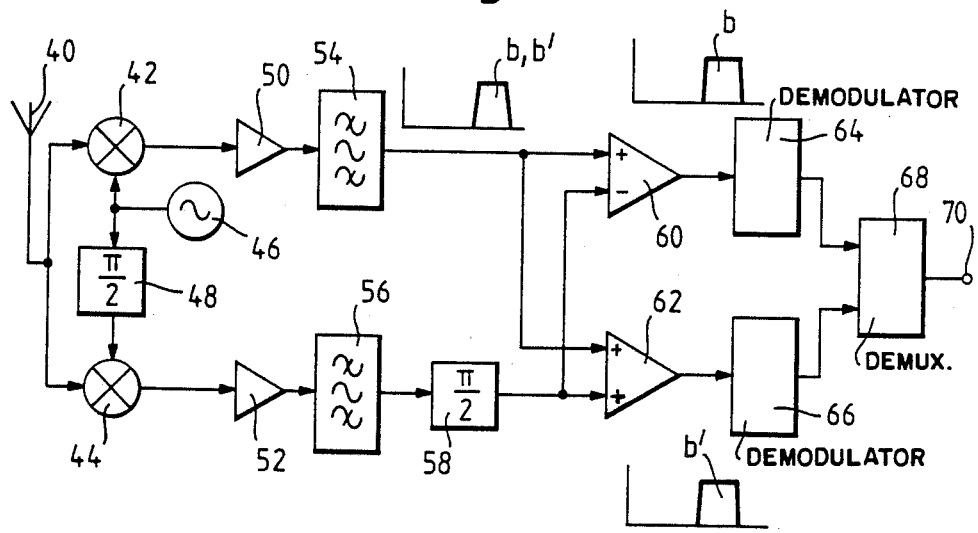
FIG. 4 is a block schematic diagram for a direct conversion receiver for use in a radio system made in accordance with the present invention.

FIG. 4 illustrates a receiver architecture suitable for use in a radio system in accordance with the present invention. An antenna 40 is connected to mixers 42, 44. A local oscillator 46 whose output frequency is set to the mid-point between the two wanted sub-channels b, b' is connected to the mixer 42 and via a 90 degrees phase shifter 48 to the mixer 44. The quadrature related frequency down-converted outputs of the mixers 42, 44 are applied, via gain stages 50, 52 including d.c. block capacitors (not shown), to bandpass filters 54, 56. The passbands of the filters 54, 56 are set to pass only the wanted sub-channels b, b'. The filtered output from the filter 56 is phase shifted by 90 degrees in a phase shifter 58 and the outputs from which and the filter 54 are arithmetically combined in a differencing amplifier 60 and a summing amplifier 62 to obtain the modulated sub-channels b and b'. The outputs of the amplifiers 60, 62 are applied to demodulators 64, 66 which perform the converse operations to those performed by the modulators 16, 18 to obtain the signals carried in the sub-channels b, b'. These signals are combined in a demultiplexer 68 which performs the converse operation to that performed by the multiplexer 14 to produce the complete message signal at terminal 70.

It will be appreciated that although the invention has been described in the form of a radio system it may take the form of another kind of transmission system, for example a system in which transmission is effected via cables.

I claim:

1. In a radio communication system comprising a plurality of transmitters transmitting signals to a plurality of receivers, the signals from respective transmitters being transmitted by modulating such signals on carrier waves having respective frequencies corresponding to respective message channels, each receiver receiving a signal in a message channel by direct conversion of the modulated signal in such channel to the frequency band of such signal, a method of operating of such system so as to separate the received signals from unwanted d.c. components produced by such direct conversion, such method comprising:

dividing the signal transmitted by each transmitter into complementary signals in respective frequency bands;

dividing the message channel of each transmitter into a pair of sub-channels in separate frequency bands symmetrically located above and below a carrier frequency assigned to such message channel, and modulating the respective complementary signals to translate them into the respective sub-channels;

assigning carrier frequencies to the respective transmitters in said system such that the sub-channels of any transmitter message channel are interleaved with a sub-channel of a message channel of least one of the other transmitter in said system;

tuning each receiver to the carrier frequency of a message channel to be received by such receiver;

each receiver directly recovering the complementary signals in the sub-channels of a received channel by converting the modulated signals in such sub-channels to the frequency bands of such complementary signals, and combining the frequency bands of the recovered complementary signals to derive a combined signal, the frequency band of such combined signal being separated from d.c.; and band-pass filtering said combined signal to separate it from other signals in the received message channel, such filtering also blocking any d.c. component of said combined signal.

2. A method as claimed in claim 1, wherein the sub-channels of the message channel of any transmitter are interleaved with a plurality of sub-channels of message channels of other transmitters in said system, lower frequency sub-channels of the interleaved channels being in successive frequency bands below the carrier frequency of the message channel and upper frequency sub-channels of the interleaved channels being in successive frequency bands above the carrier frequency of the message channel.

3. A transmitter for use in a radio communication system operating as claimed in claim 1, comprising means for dividing an input signal into first and second complementary signals and means for translating said first and second complementary signals into first and second sub-channels, respectively, of a message channel corresponding to a carrier frequency of the transmitter; said sub-channels occupying mutually different portions of said message channel frequency spectrum and which are situated symmetrically above and below the transmitter carrier frequency and separated therefrom by at least the frequency bandwidth of a sub-channel.

4. A transmitter as claimed in claim 3, wherein the frequency translating means comprise means for modulating said first and second complementary signals respectively onto first and second sub-carriers the frequencies of which are separated from the transmitter carrier frequency by half the sub-channel separation frequency, means for obtaining the sum and the difference of the modulated signals produced by the modulating means, means for producing a relative 90 degree phase-shift between the resulting sum and difference signals, means for frequency translating-up the relatively phase-shifted signals using quadrature related carrier signals, and means for combining the frequency translated signals.

5. A direct conversion receiver for use in a radio system operating as claimed in claim 1, comprising a pair of mixers for producing quadrature related output signals, a local oscillator for supplying to said mixers a signal having a frequency mid-way between the frequency bands occupied by the sub-channels of a selected channel, bandpass filtering means and phase-shifting means for filtering the output signals from the mixers to obtain signals lying within said frequency bands frequency-translated by said mixers and producing a relative 90 degree phase-shift between the outputs signals of said mixers, summing and differencing means for obtaining the sum of the difference between the filtered and relatively phase-shifted signals, respective demodulating means for the resulting sum and difference signals, and means for combining the output signals of said demodulating means to reconstitute the signals originally supplied to the selected channel.

6. A system for transmitting at least two signal channels comprising:

means for dividing each channel into first and second complementary sub-channels which occupy frequency bands symmetrical about a common sub-carrier frequency;

means for adding signals in the sub-channels to form a first modulating signal;

means for subtracting signals in the sub-channels to form a second modulating signal;

means for phase shifting the second modulating signal from said means for substracting;

a carrier generator for generating first and second carrier signals of a different phase but identical frequency;

means for modulating said first carrier signal with the signal from said means for adding, and for modulating said second carrier signal with the signal from said means for phase sifting; and means for combining the modulated first and second carriers from said means for modulating, whereby a single modulated carrier signal is produced containing said complementary sub-channels which are frequency symmetrical with respect to the frequency of said carrier signals.

7. A receiver for receiving a carrier frequency signal modulated with signals in first and second sub-channels which are frequency symmetrical with respect to said carrier frequency signal, said first sub-channel having a frequency position below said carrier signal frequency, said second sub-channel having a frequency position above said carrier frequency signal; said receiver comprising:

a local oscillator producing first and second signals having the same frequency but different phase;

mixer means connected to receive said modulated carrier frequency signal having said first and second complementary sub-channels, and for receiving from said local oscillator said first and second signals having the same frequency, said mixer means producing first and second phase displaced output signals;

a signal adding circuit connected to said mixer means for adding the first and second phase displaced signals together to form a summation signal;

a signal substraction circuit for forming a difference signal from the first and second phase displaced signals produced by said mixer means;

demodulator means connected to said signal adding and subtracting circuits to receive said summation and difference signals and for forming therefrom first and second baseband signals containing information in said first and second sub-channels; and a demultiplexer connected to receive said first and second baseband signals and form a single channel from said complementary sub-channels.

8. The transmitter of claim 6 further comprising:

means for generating additional modulated carrier signals containing respective complementary sub-channels which are frequency symmetrical with respect to their respective carrier signals, said sub-channels having the same frequency offset with their respective carrier signals; and, means for interleaving said modulated carrier signals, whereby a plurality of interleaved sub-channels are produced.

* * * * *